United States Patent
Hariya

(10) Patent No.: US 10,119,193 B2
(45) Date of Patent: Nov. 6, 2018

(54) METHOD OF MANUFACTURING AN EPITAXIAL WAFER COMPRISING MEASURING A LEVEL DIFFERENCE BETWEEN A FRONT SURFACE OF A SUSCEPTOR AND AN UPPER SURFACE OF A LIFT PIN AND ADJUSTING A RATIO OF THE HEAT SOURCE OUTPUT

(71) Applicant: SHIN-ETSU HANDOTAI CO., LTD., Tokyo (JP)

(72) Inventor: Hideki Hariya, Fukushima (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 15/534,904

(22) PCT Filed: Nov. 17, 2015

(86) PCT No.: PCT/JP2015/082216
§ 371 (c)(1),
(2) Date: Jun. 9, 2017

(87) PCT Pub. No.: WO2016/098510
PCT Pub. Date: Jun. 23, 2016

(65) Prior Publication Data
US 2017/0356088 A1    Dec. 14, 2017

(30) Foreign Application Priority Data

Dec. 19, 2014 (JP) ................. 2014-257863

(51) Int. Cl.
C30B 25/12 (2006.01)
C23C 16/52 (2006.01)
(Continued)

(52) U.S. Cl.
CPC ............ *C23C 16/52* (2013.01); *C23C 16/46* (2013.01); *C30B 25/12* (2013.01); *C30B 25/186* (2013.01);
(Continued)

(58) Field of Classification Search
CPC ......... C30B 25/00; C30B 25/02; C30B 25/10; C30B 25/12; C30B 25/16; C30B 25/18;
(Continued)

(56) References Cited

U.S. PATENT DOCUMENTS

| 2003/0124820 A1* | 7/2003 | Johnsgard | ............ C23C 16/455 |
| | | | 438/482 |
| 2009/0272719 A1* | 11/2009 | Collins | .................. C30B 25/12 |
| | | | 216/58 |
| 2011/0114014 A1* | 5/2011 | Sakurai | .................. C23C 16/24 |
| | | | 117/88 |

FOREIGN PATENT DOCUMENTS

| JP | 2000-026192 A | 1/2000 |
| JP | 2000-323556 A | 11/2000 |

(Continued)

OTHER PUBLICATIONS

Japenese Office Action of related Japense Application No. 2014-0257863 dated Mar. 10, 2017.

*Primary Examiner* — Kenneth A Bratland, Jr.
(74) *Attorney, Agent, or Firm* — Arent Fox LLP

(57) ABSTRACT

Provided is a method of manufacturing an epitaxial wafer, which includes vapor-phase growing an epitaxial layer on a substrate W placed on a susceptor 3 in a state where an upper surface 4b1 of a lift pin 4 inserted in a through-hole H of the susceptor 3 retracts or projects with respect to an upper opening H1a of the through-hole H. A level difference D from the upper surface 4b1 of the lift pin 4 to the opening H1a of the through-hole H is measured with laser light, and outputs, during epitaxial growth, of heaters 9 located above (Continued)

and beneath the susceptor 3 are adjusted on the basis of the measured level difference D. Thus, a method of manufacturing an epitaxial wafer, which facilitates adjustment of the outputs of the heat sources during epitaxial growth, is provided.

4 Claims, 5 Drawing Sheets

(51) Int. Cl.
*C30B 29/06* (2006.01)
*C30B 25/18* (2006.01)
*C30B 25/20* (2006.01)
*C30B 33/02* (2006.01)
*H01L 21/02* (2006.01)
*H01L 21/205* (2006.01)
*H01L 21/322* (2006.01)
*C23C 16/46* (2006.01)

(52) U.S. Cl.
CPC ............. *C30B 25/20* (2013.01); *C30B 29/06* (2013.01); *C30B 33/02* (2013.01); *H01L 21/02576* (2013.01); *H01L 21/205* (2013.01); *H01L 21/3225* (2013.01)

(58) Field of Classification Search
CPC ....... C30B 25/186; C30B 25/20; C30B 29/00; C30B 29/02; C30B 29/06; C30B 33/00; C30B 33/02; C23C 16/44; C23C 16/46; C23C 16/52; H01L 21/02576; H01L 21/205; H01L 21/3225
USPC ........ 117/84–86, 88–89, 105, 107, 911, 928, 117/935
See application file for complete search history.

(56) References Cited

FOREIGN PATENT DOCUMENTS

JP          2000323556 A   *   11/2000
WO    WO 2010/013646 A1    2/2010

* cited by examiner

METHOD OF MANUFACTURING AN EPITAXIAL WAFER COMPRISING MEASURING A LEVEL DIFFERENCE BETWEEN A FRONT SURFACE OF A SUSCEPTOR AND AN UPPER SURFACE OF A LIFT PIN AND ADJUSTING A RATIO OF THE HEAT SOURCE OUTPUT

CROSS-REFERENCE TO RELATED APPLICATIONS

This present application is a National Stage entry of International Application No. PCT/JP2015/082216, filed Nov. 17, 2015, which claims priority to Japanese Patent Application No. 2014-257863, filed Dec. 19, 2014. The disclosures of the prior applications are incorporated in their entirety herein by reference.

FIELD OF THE INVENTION

This invention relates to a method of manufacturing an epitaxial wafer.

BACKGROUND OF THE INVENTION

A substrate for growth, on which epitaxial layers are grown during epitaxial growth, is placed on a disc-like susceptor, for example. The susceptor has a plurality of through-holes formed penetrating through the front and rear surfaces thereof, and as disclosed in Patent Document 1, for example, a lift pin is inserted in each through-hole, and the lift pin is vertically movable with respect to the susceptor. The vertical movement of the plurality of lift pins inserted in the respective through-holes enables transfer of a wafer between the lift pins and the susceptor.

When a wafer transferred above the susceptor is placed on the susceptor, the plurality of lift pins are caused to project upward from the through-holes, and the wafer is received such that the rear surface thereof is supported by the upper surfaces of the projecting lift pins. Then, the lift pins, supporting the wafer, are moved downward to lower the wafer on the susceptor, whereby the wafer is placed on the susceptor. The lift pins, which have placed the wafer on the susceptor, are suspended such that the upper surfaces thereof retract into the through-holes, and the upper edges thereof are caught by the through-holes. Thereafter, epitaxial layers are vapor-phase grown on the wafer placed on the susceptor.

During the epitaxial growth, the wafer is heated by heat sources located above and beneath the susceptor. The heat that heats the wafer is also transmitted to each lift pin, the upper edge of which is caught by the through-hole of the susceptor, and heat dissipation or the like from the lift pin occurs during the epitaxial growth, which causes a difference in temperature between the area around the lift pin and other areas. Therefore, in the susceptor and the wafer during the epitaxial growth, a local temperature difference may occur in an area depending on whether or not the area is near the lift pin. If the epitaxial growth proceeds with such a temperature difference, flatness of each epitaxial layer is deteriorated.

Hence, the temperature difference caused by the lift pins is suppressed by adjusting the balance of outputs of the heat sources located above and beneath the susceptor, thereby to make the surface of each epitaxial layer flat.

CITATION LIST

Patent Document

Patent Document 1: Japanese Laid-Open Patent Publication No. 2000-26192

SUMMARY OF INVENTION

Problems to be Solved by the Invention

However, the temperature difference caused by heat dissipation from the lift pins changes in accordance with the positional relationship between the upper surface of each lift pin inserted in the corresponding through-hole and an upper opening of the through-hole (an opening at the front surface side of the susceptor). That is, the temperature difference changes in accordance with a level difference that is formed between the lift pin and the susceptor when the upper surface of the lift pin inserted in the through-hole is positioned so as to retract or project with respect to the upper opening of the through-hole. Further, the level difference depends on the finished dimensions of the susceptor and the lift pin, and the level difference changes within a range of design errors of the finished dimensions of the susceptor and the lift pin. Therefore, the temperature difference caused by the lift pin changes depending on the combination of the susceptor and the lift pin used for epitaxial growth, and the output balance of the upper and lower heat sources needs to be adjusted every time the combination changes, which makes the adjustment troublesome.

An object of this invention is to provide a method of manufacturing an epitaxial wafer, which facilitates adjustment of outputs of heat sources during epitaxial growth.

Solution to the Problems and Effects of the Invention

A method of manufacturing an epitaxial wafer according to the invention is a method of growing an epitaxial layer on a substrate placed on a susceptor while heating the substrate with upper and lower heat sources located above and beneath the susceptor, respectively, in a state where an upper surface of a lift pin inserted in a through-hole having openings at a front and rear surfaces of the susceptor has a level difference with respect to the opening at the front surface side. The method includes an adjustment step of measuring a level difference from the opening to the upper surface of the lift pin in the above state, and adjusting outputs of the upper and lower heat sources on the basis of the measured level difference.

The upper surface of the lift pin inserted in the through-hole retracts or projects with respect to the opening of the through-hole (the opening at the front side of the susceptor), whereby a level difference occurs between the opening of the through-hole and the upper surface of the lift pin. The level difference from the opening at the front side of the susceptor to the upper surface of the lift pin becomes a factor that causes a change in the value of a local temperature difference that occurs in the wafer and the susceptor around the lift pin during epitaxial growth. In this invention, the level difference that becomes such a factor is measured, and the outputs of the upper and lower heat sources are adjusted on the basis of the measured level difference. Therefore, by presuming the value of a temperature difference, which may occur in the wafer and the susceptor, on the basis of the measured level difference, it is possible to facilitate adjustment of the outputs of the heat sources by using the measured level difference as a guideline. In the case where the upper surface of the lift pin is flush with the front-side opening of the through-hole, the level difference is zero. However, in this specification, the state where the level difference is zero is also regarded as a "state where a level difference is present", that is, the state where the level difference is zero is not excluded.

In one embodiment of the invention, in the adjustment step, a ratio of the output of the upper heat source located above the susceptor to the output of the lower heat source located beneath the susceptor is adjustable.

An appropriate pair of the level difference and the ratio of the outputs, which pair is suitable for flattening the surface of the epitaxial layer, has been set in advance within a predetermined range of the level difference. In the adjustment step, when the measured level difference is within the predetermined range, the outputs of the heaters can be adjusted to the ratio that makes an appropriate pair with the measured level difference.

By setting the appropriate ratio (ratio of the outputs of the upper and lower heat sources) corresponding to the measured level difference in advance, the time required for selecting the ratio corresponding to the measured level difference is reduced, thereby facilitating adjustment of the outputs of the heat sources during epitaxial growth. As a result, productivity of epitaxial wafers can be improved.

Further, in the adjustment step, the susceptor and the lift pin can be replaced when the measured level difference is outside the predetermined range. Therefore, by replacing the susceptor and the lift pin when the measured level difference is not suitable for flattening the surface of the epitaxial layer, it is possible to select in advance a susceptor and a lift pin that ensure an appropriate level difference.

In the embodiment of the invention, assuming that the total of the outputs of the upper and lower heat sources is 100%, the ratio of the output of the upper heat source to the output of the lower heat source can be adjusted within a range of 55%:45% to 40%:60%.

The ratio of the outputs of the upper and lower heat sources adversely affects the growth speed of the epitaxial layer during vapor phase growth, nano-topology at the rear surface of the manufactured epitaxial wafer, and peripheral deposition at the rear surface of the epitaxial wafer. Therefore, by adjusting the outputs of the heat sources within the above range, the ratio of the outputs of the heat sources is suppressed from adversely affecting the epitaxial layer growth speed, etc.

Therefore, if the ratio of the outputs, which makes an appropriate pair with the measured level difference, is within the range of 55%:45% to 40%:60%, the surface of the epitaxial layer can be flattened, and adverse effects on the epitaxial layer growth speed, etc. can be suppressed.

In the embodiment of the invention, the level difference can be measured by using a laser in the adjustment step. Using the laser for the measurement enables highly accurate measurement of the level difference.

DESCRIPTION OF EMBODIMENTS

A manufacturing method of this invention includes: measuring the positional relationship between a susceptor and a lift pin of a vapor phase growth apparatus for growing epitaxial layers on a substrate for growth; and adjusting temperature conditions during the epitaxial growth on the basis of the result of the measurement. In the following description, the vapor phase growth apparatus is described first and then a measurement apparatus for measuring the positional relationship between a susceptor and a lift pin is described.

Figure 1A:
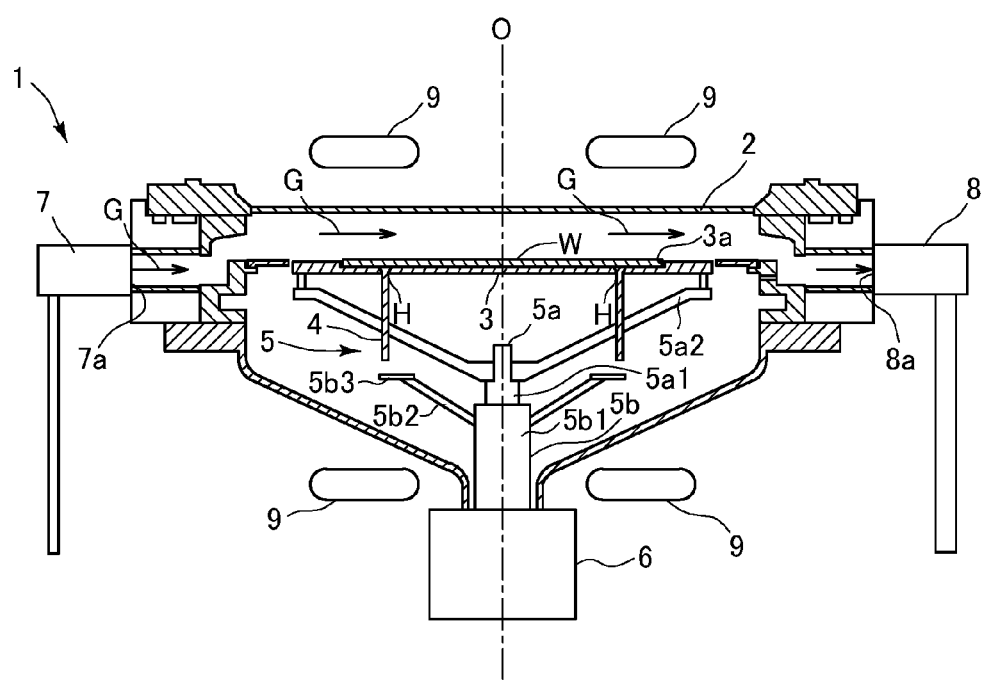
FIG. 1A is a schematic cross-sectional view showing an example of a vapor phase growth apparatus used for the invention.

FIG. 1A shows an example of a single-wafer-processing-type vapor phase growth apparatus 1 used in the manufacturing method of the invention. Epitaxial layers are vapor-phase grown on a substrate-for-growth W by the vapor phase growth apparatus 1, whereby an epitaxial wafer is manufactured.

The vapor phase growth apparatus 1 includes a reaction furnace 2 composed of a transparent quartz member, a metal member such as stainless steel, and the like. Provided in the reaction furnace 2 are: a susceptor 3; lift pins 4 that receive/transfer the substrate W from/to the susceptor 3; a support member 5 that supports the susceptor 3 and the lift pins 4; and a driver 6 that drives the susceptor 3 and the lift pins 4 through the support member 5.

The susceptor 3 is formed in a disc shape to support the substrate W substantially horizontally. The susceptor 3 includes: a pocket portion 3a that is located at the surface of the susceptor 3 and is recessed in a disc shape; and a plurality of (three) through-holes H that penetrate the susceptor 3 from the front surface of the pocket portion 3a to the rear surface of the susceptor 3. The pocket portion 3a is formed by hollowing a portion of the susceptor 3 at the upper surface so as to have a diameter a little larger than the diameter of the substrate W and have a depth equivalent to the thickness of the substrate W.

Figure 1B:
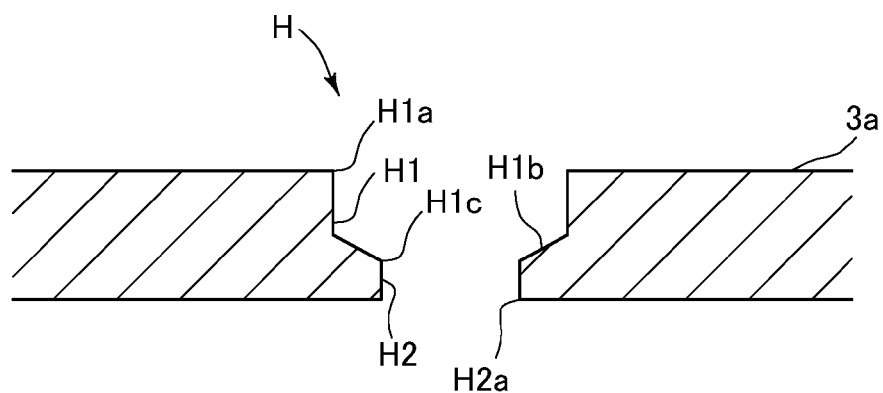
FIG. 1B is a partial enlarged view of a through-hole shown in FIG. 1A.

When the susceptor 3 is seen from the front surface side, the three through-holes H are formed around the center of the disc-like pocket portion 3a. As shown in FIG. 1B, each through-hole H is formed in a funnel shape, and includes a mortar-shaped upper portion H1, and a cylindrical lower portion H2 connecting with the upper portion H1. The upper portion H1 includes: an opening H1a located at the front surface side of the pocket portion 3a; a taper portion H1b that is tapered downward from the opening H1a side; and a connection port H1c that is located at a lower end of the taper portion H1b and connects the upper portion H1 with the lower portion H2. The lower portion H2 includes: the connection port H1c; and an opening H2a located at the rear surface side of the susceptor 3.

Figure 1C:
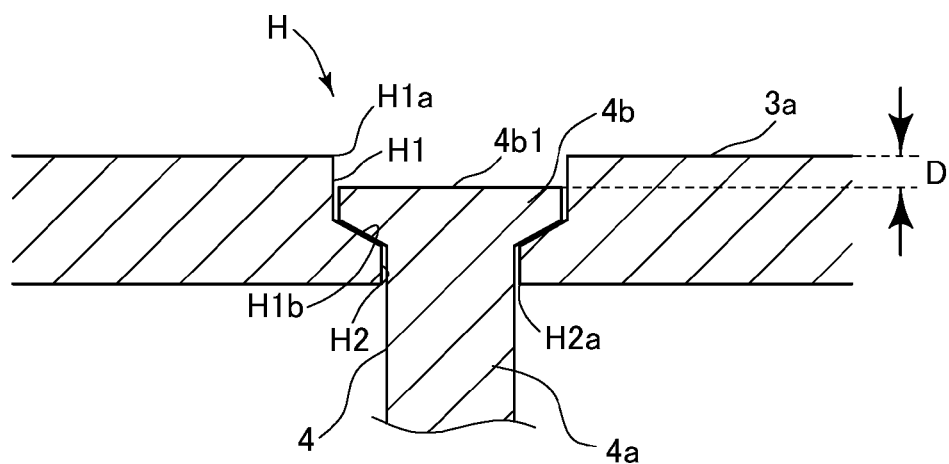
FIG. 1C is a partial enlarged view of the through-hole shown in FIG. 1B in which a lift pin is inserted.
Figure 2A:
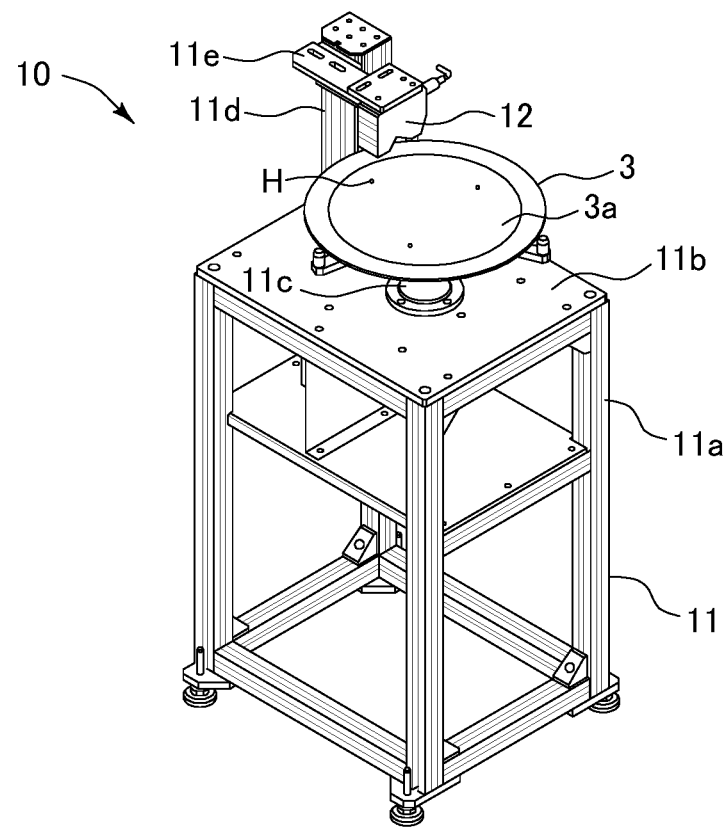
FIG. 2A is a schematic perspective view showing an example of a measurement apparatus that measures a level difference from an upper surface of a lift pin hanging from a through-hole, to an opening of the through-hole (an opening at the front side of a susceptor).
Figure 2B:
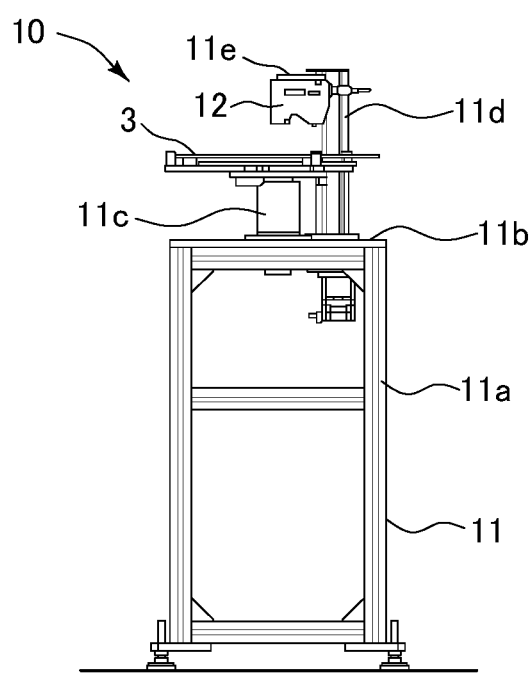
FIG. 2B is a schematic side view of the measurement apparatus shown in FIG. 2A.
Figure 2C:
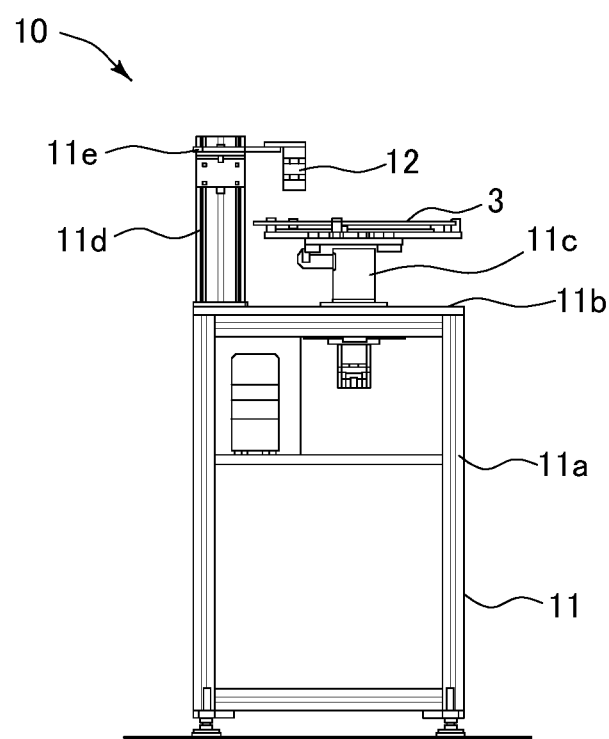
FIG. 2C is a schematic front view of the measurement apparatus shown in FIG. 2A.
Figure 2D:
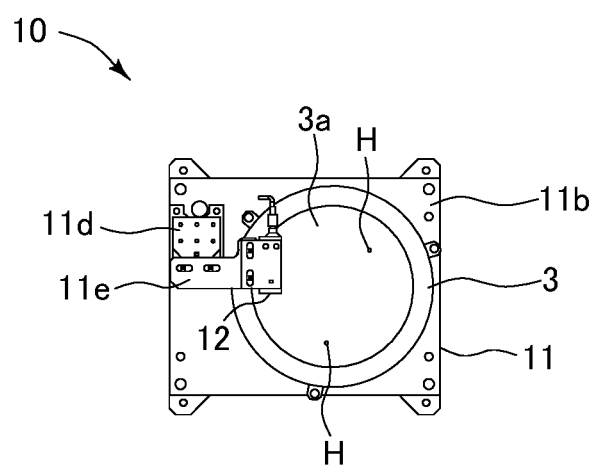
FIG. 2D is a schematic plan view of the measurement apparatus shown in FIG. 2A.

As shown in FIG. 1C, each lift pin 4 is inserted in the through-hole H. The lift pin 4 receives/transfers the substrate W from/to the susceptor 3. The lift pin 4 includes: a main body 4a formed in a round rod shape; and a head portion 4b that has a mortar shape (a filled-up mortar shape) and connects with an upper end of the main body 4a. The head portion 4b is formed in a mortar shape smaller than the upper portion H1 of the through-hole H, and has an upper surface 4b1 that supports the rear surface of the substrate W. When the lift pin 4 is inserted in the opening H1a of the through-hole H from the leg side of the lift pin 4 (the side opposite to the head portion 4b), the head portion 4b of the lift pin 4 is caught by the taper portion H1b of the through-hole H. The lift pin 4, being caught by the taper portion H1b, hangs from the through-hole H, and thus a space corresponding to a level difference D is formed between the upper surface 4b1 of the lift pin 4 and the opening H1a of the through-hole H.

Referring back to FIG. 1A, the support member 5 includes: a susceptor support member 5a that supports the susceptor 3; and a lift pin support member 5b that supports the lift pin 4 when the substrate W is received/transferred between the susceptor 3 and the lift pin 4. The susceptor support member 5a is formed in a Y shape at the cross section, and is located so as to support the susceptor 3 substantially horizontally from the rear surface side of the susceptor 3. The susceptor support member 5a includes: a pillar portion 5a1 that extends in a pillar shape in the vertical direction; and an arm 5a2 that extends radially from the upper portion of the pillar portion 5a1 and is connected to the rear surface of the susceptor 3. The lift pin support member 5b includes: a cylindrical portion 5b1 that cylindrically extends surrounding the pillar portion 5a1; and a lift arm 5b2 that radially extends from the upper portion of the cylindrical portion 5b1 and is located near the lower end of the lift pin 4. The lift arm 5b2 includes, at an upper end thereof, a support board 5b3 capable of supporting the lower end of the lift pin 4.

The driver 6 is connected to the lower portions of the pillar portion 5a1 and the cylindrical portion 5b1. The driver 6 is configured as a driving means (e.g., a motor) that drives the pillar portion 5a1 and the cylindrical portion 5b1 independently from each other to cause these portions to move vertically and rotate around an axis O (in the vertical direction). When the driver 6 drives the cylindrical portion 5b1 to move upward from the position shown in FIG. 1A, the support board 5b3 moves upward together with the cylindrical portion 5b1, and the support board 5b3 supports the lower end of each lift pin 4 and moves the lift pin 4 upward. In order to move each lift pin 4 downward, an operation reverse to the above-mentioned operation is performed.

To the left and the right of the reaction furnace 2, a gas introduction tube 7 and a gas discharge tube 8 are connected, respectively. The gas introduction tube 7 is located to be connected to one end of the reaction furnace 2 in the horizontal direction, and introduces, substantially horizontally, various gases into the reaction furnace 2. The gas introduction tube 7 introduces the gas into the reaction furnace 2 from a gas introduction port 7a communicating with the reaction furnace 2. The gas introduction tube 7, when vapor phase growth is performed, introduces a vapor-phase growth gas G into the reaction furnace 2 from the gas introduction port 7a. The vapor-phase growth gas G contains: a raw material gas as a raw material of an epitaxial layer; a carrier gas that dilutes the raw material gas; and a dopant gas that gives a certain conductivity type to a thin film.

On the other end of the gas introduction tube 7, the gas discharge tube 8 is connected, through which a gas (for example, the vapor-phase growth gas G that has passed above the substrate W) in the reaction furnace 2 is discharged. The gas discharge tube 8 discharges the vapor-phase growth gas G or the like introduced into the reaction furnace 2, from a gas discharge port 8a communicating with the reaction furnace 2, to the outside of the reaction furnace 2.

Above and beneath the reaction furnace 2 (above and beneath the susceptor 3), a plurality of heaters 9 are disposed, which serve as heat sources for heating the reaction furnace 2 during vapor phase growth to adjust the temperature inside the reaction furnace 2. The output of the heater 9 located above the susceptor 3 and the output of the heater 9 located beneath the susceptor 3 are controlled by a heater controller (not shown). The heater controller adjusts the ratio of the output of the upper heater 9 to the output of the lower heater 9. During epitaxial growth, for example, assuming that the total of the outputs of the upper and lower heaters 9 is 100%, adjustment is performed such that the ratio of the output of the upper heater 9 to the output of the lower heater 9 is within a range of 55%:45% to 40%:60%. In other words, assuming that the total of the outputs of the upper and lower heaters 9 is 100%, the outputs of the upper and lower heaters 9 are adjusted such that the output of the lower heater 9 is within a range of 45% to 60%.

The substrate W is transferred to the vapor phase growth apparatus 1 configured as described above, and an epitaxial layer is vapor-phase grown on the substrate W. The substrate W is transferred above the susceptor 3 in the reaction furnace 2 by a transfer means (not shown). The substrate W transferred above the susceptor 3 is placed on the susceptor 3 in the following manner.

The driver 6 causes the support board 5b3 to move upward. The support board 5b3 moved upward supports the lower end of each lift pin 4 and lifts the lift pin 4 to cause the lift pin 4 to project from the through-hole H. The lift pin 4 is moved upward until the head portion 4b thereof projecting from the through-hole H reaches the rear surface of the substrate W, and thereafter, the lift pin 4 receives the substrate W, with the upper surface 4b1 of the head portion 4b thereof supporting the rear surface of the substrate W. After the lift pin 4 has received the substrate W, the support board 5b3 is moved downward to move the lift pin 4 downward with the substrate W being supported by the lift pin 4. When the lift pin 4 is moved downward and the substrate W supported by the lift pin 4 is placed on the pocket portion 3a, the head portion 4b of the lift pin 4 is further moved downward to be separated from the rear surface of the substrate W. Thereafter, the lift pin 4 hangs from the through-hole H, with the head portion 4b being caught by the taper portion H1b of the through-hole H (FIG. 1C), whereby the support board 5b3 supporting the lower end of the lift pin 4 is separated from the lift pin 4. With the lift pin 4 hanging from the through-hole H, epitaxial growth is performed on the substrate W to manufacture an epitaxial wafer.

During the epitaxial growth, the substrate W is heated by the heaters 9 located above and beneath the susceptor 3. The heat that heats the substrate W is also transmitted to the lift pin 4 hanging from the through-hole H, and the heat transmitted to the lift pin 4 is, for example, dissipated from the lift pin 4, whereby a temperature difference occurs between an area around the lift pin 4 and other areas. The thermal migration condition, of the heat transmitted from the lift pin 4, changes in accordance with a level difference D (FIG. 1C) from the upper surface 4b1 of the lift pin 4 inserted in the through-hole H to the opening H1 of the through-hole H, and thereby the value of the temperature difference caused by the lift pin 4 also changes. Further, since the level difference D depends on the finished dimensions of the susceptor 3 and the lift pin 4, if the susceptor 3 and the lift pin 4 are, for example, replaced, the level difference D changes. Therefore, the temperature difference caused by the level difference D changes every time the pair of the susceptor 3 and the lift pin 4 is changed. In order to suppress the change in the temperature difference, the balance of the outputs of the upper and lower heaters 9 needs to be adjusted, but such adjustment is troublesome.

Hence, in an embodiment of the invention, the level difference D that changes depending on the finished dimensions of the susceptor 3 and the lift pin 4 is measured by a measurement apparatus, and the outputs of the upper and lower heaters 9 are adjusted on the basis of the measured level difference D. That is, the value of a temperature difference that may occur in the substrate W and the susceptor 3 due to the lift pin 4 is presumed on the basis of the measured level difference D, and adjustment of the outputs of the heaters 9 is facilitated by using the measured level difference D as a guideline. FIGS. 2A to 2D show an example of a measurement apparatus 10 for measuring a level difference D from the opening H1a of the through-hole H to the upper surface 4b1 of the lift pin 4. Hereinafter, the measurement apparatus 10 is described. When measuring a level difference D, the measurement apparatus 10 measures the level difference D from a susceptor 3 and lift pins 4 before being assembled in the vapor phase growth apparatus 1. It is noted that the lift pins 4 are not shown in FIGS. 2A to 2D.

The measurement apparatus 10 includes: a base part 11 that supports the susceptor 3 and the lift pins 4 to be set in the vapor phase growth apparatus 1; and a measurement part 12 that measures the positional relationship between the susceptor 3 and the lift pins 4 supported by the base part 11.

The base part 11 has: a frame 11a having a rectangular parallelepiped shape; a top plate lib located at an uppermost portion of the frame 11a; a pedestal 11c that is located in the center of the top plate 11b and supports the rear surface of the susceptor 3; and a pillar 11d projecting upward from a corner of the top plate 11b. The pillar 11d includes an arm portion 11e extending from an upper portion of the pillar 11d toward a space above the through-hole H of the susceptor 3 supported by the pedestal 11c. The measurement part 12 is mounted to the arm portion 11e.

The measurement part 12 is configured as a distance sensor for measuring a level difference D that is formed when the upper surface 4b of the lift pin 4 retracts or projects with respect to the opening H1a of the through-hole H (refer to FIG. 1C which shows the case where the upper surface 4b retracts). When a well-known laser displacement meter is used as the distance sensor, the level difference D is measured as follows, for example. First, laser light is emitted from a semiconductor laser of the laser displacement meter toward the through-hole H and its vicinity on the susceptor 3 supported by the pedestal 11c. The emitted laser light is reflected at the upper surface of the lift pin 4, the surface of the susceptor 3, the inner surface of the through-hole H, and the like. The reflected light is guided to an image sensor in the laser displacement meter so as to form an image on the image sensor. Then, a level difference D, from the upper surface of the lift pin 4 irradiated with the laser light to the opening H1a of the through-hole H, is measured by using the image formed on the image sensor. Thus, a distance from the opening H1a of the through-hole H to the upper surface 4b1 of the lift pin 4 is measured as the level difference D (refer to FIG. 1C).

By using the measurement apparatus 10 configured as described above, the level difference D, which is formed by the susceptor 3 and the lift pin 4 before being set in the vapor phase growth apparatus 1, is measured in advance. On the basis of the measured level difference D, the value of a temperature difference that may occur near the substrate W and the susceptor 3 due to the lift pin 4 during vapor phase growth is presumed, whereby adjustment of the outputs of the heaters 9 can be facilitated by using the measured level difference D as a guideline.

Example

The following experiment was conducted to confirm the effect of the invention.

Figure 3:
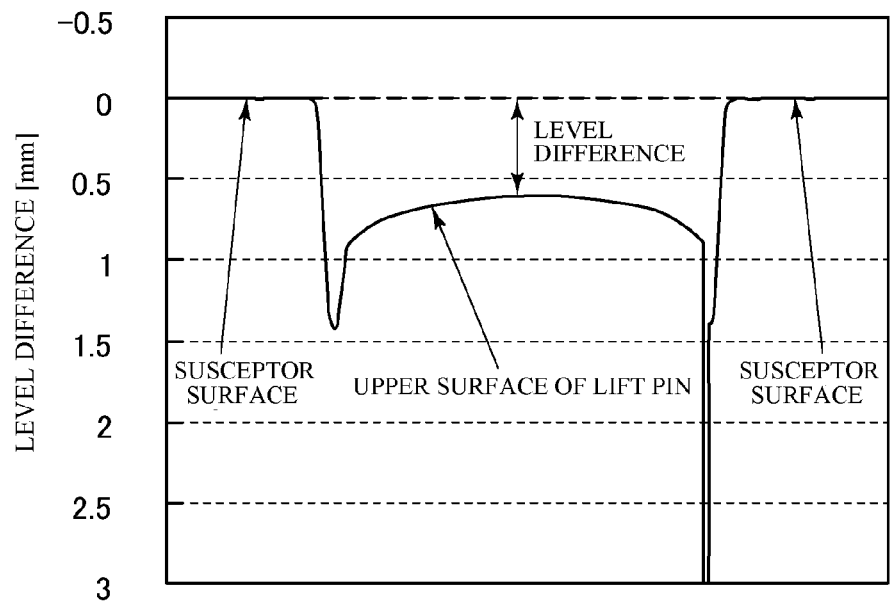
FIG. 3 is a graph showing a result of measurement of a level difference from an upper surface of a lift pin hanging from a through-hole to an opening of the through-hole (an opening at the front side of a susceptor) by using the measurement apparatus shown in FIG. 2A.

A plurality of pairs of the susceptor 3 and the lift pin 4 before being assembled in the vapor phase growth apparatus 1 were prepared, and each pair was subjected to measurement of a level difference D (distance from the opening H1a of the through-hole H to the upper surface 4b1 of the lift pin 4) by the measurement apparatus 10. As the measurement part 12 of the measurement apparatus 10, an ultra-high speed in-line profilometer (LJ-V6080) produced by KEYENCE CORPORATION was adopted. FIG. 3 shows one measurement result of the level difference D measured by using the measurement apparatus 10, in which the level difference D from the opening H1a to the upper surface 4b1 of the lift pin 4 is measured. In this example, the level difference D in the state where the upper surface 4b1 of the lift pin 4 retracts in the through-hole H is represented by a positive value. The level difference D in the state where the upper surface 4b1 of the lift pin 4 projects from the through-hole H is represented by a negative value, although not shown in this example.

Next, from among the plurality of pairs of the susceptor 3 and the lift pin 4 that have been subjected to measurement of the level difference D, a pair 1, the level difference D of which was close to 0 mm (positive value), was extracted, and a pair 2, the level difference D of which was about 0.2 mm increased from that of the pair 1, was extracted. Further, a pair 3, the level difference D of which was about 0.2 mm increased from that of the pair 2, was extracted, followed by extraction of a pair 4 and a pair 5 in a similar manner. Thus, the pairs 1 to 5, the level differences D of which were within a range of 0 to 1 mm, were extracted. That is, the pairs 1 to 5, the level differences D of which were in the state where the upper surface 4b1 of the lift pin 4 retracted in the through-hole H, were extracted.

The susceptor 3 and the lift pin 4 of each of the extracted pairs 1 to 5 were assembled in the vapor phase growth apparatus 1, and a plurality of epitaxial wafers were manufactured for each of the pairs 1 to 5. Specifically, a silicon epitaxial wafer was manufactured by growing a silicon epitaxial layer on a silicon single-crystal substrate. When manufacturing the plurality of epitaxial wafers for each of the pairs 1 to 5, the outputs of the upper and lower heaters 9 during the epitaxial growth were set as follows. Five epitaxial wafers were manufactured while assuming that the total of the outputs of the heaters 9 located above and beneath the susceptor 3 was 100%, and changing the output of the lower heater 9 to 52%, 54%, 56%, 58%, and 60% (at this time, the output of the upper heater 9 was changed to 48%, 46%, 44%, 42%, and 40% corresponding to the output of the lower heater 9). Then, irregularity at the surface of the epitaxial layer of each of the manufactured epitaxial wafers (irregularity of the epitaxial layer positioned directly above the lift pin 4) was observed, and the output of the lower heater 9 at which the irregularity was most reduced was obtained.

Figure 4:
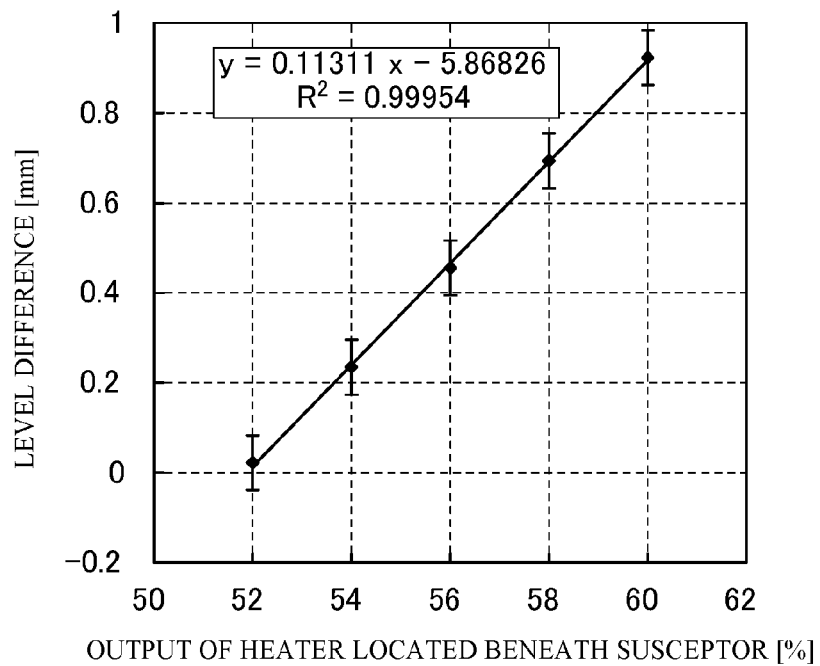
FIG. 4 is a graph showing a result of investigation of an optimum output of a heat source (lower heat source) during epitaxial growth, with respect to a level difference from an upper surface of a lift pin hanging from a through-hole to an opening of the through-hole (an opening at the front side of a susceptor).

FIG. 4 shows a graph on which the percentages of the outputs of the lower heater 9, at which irregularity of the epitaxial layer was most reduced, and the values of the level differences D corresponding to the percentages, which were obtained from the respective pairs 1 to 5, are plotted, and an approximate line is drawn based on the plots. The approximate line indicates appropriate pairs of the level differences D and the outputs (%) of the lower heater 9, which are suitable for flattening the surface of the epitaxial layer, and the approximate line is set within a range of 52% to 60% for the output of the lower heater 9.

The level difference D is measured by the measurement apparatus 10, and an appropriate percentage of the output of the lower heater 9, which corresponds to the measured level difference D, is obtained from the graph shown in FIG. 4, whereby appropriate level difference D and percentage of output, at which the surface of the epitaxial layer can be flattened, can be obtained. Therefore, the time required for selecting the percentage of the output of the heater 9, which corresponds to the measured level difference D, is reduced, and adjustment of the outputs of the upper and lower heaters 9 during epitaxial growth is facilitated. In addition, even when the level difference D is changed due to the finished dimensions of the susceptor 3 and the lift pin 4, adjustment of the percentage of the output of the heater 9, which corresponds to the level difference D, is facilitated on the basis of the graph shown in FIG. 4. Accordingly, productivity of epitaxial wafers can be improved.

In the case where the corresponding percentage of the output of the heater 9 cannot be obtained from FIG. 4 because the measured level difference D is great (e.g., equal to or greater than 1 mm) or a negative value, the susceptor 3 and the lift pin 4 may be replaced. Therefore, a susceptor 3 and a lift pin 4, which ensure an appropriate depth D, can be selected before the vapor phase growth apparatus 1 is used.

In the graph shown in FIG. 4, the percentage of the output of the lower heater 9 ranges from 52% to 60%. Therefore, the output of the heater 9 does not adversely affect the growth speed of the epitaxial layer during vapor phase growth, nano-topology at the rear surface of the manufactured epitaxial wafer, and peripheral deposition at the rear surface of the epitaxial wafer. Therefore, the surface of the epitaxial layer can be flattened, and the epitaxial layer growth speed and the like are suppressed from being adversely affected.

The invention is not limited to the above embodiment. The embodiment is merely an example, and any embodiment having substantially the same configuration and having the same operational effects as those of the technical idea described in claims of the invention is incorporated into a technical scope of the invention.

DESCRIPTION OF THE REFERENCE CHARACTERS

1 vapor phase growth apparatus
2 reaction furnace
3 susceptor
4 lift pin
4b1 upper surface
5 support member
6 driver
10 measurement apparatus
12 measurement part
H through-hole
H1a opening
D level difference

The invention claimed is:

1. A method of manufacturing an epitaxial wafer, the method including growing an epitaxial layer on a substrate placed on a susceptor while heating the substrate with upper and lower heat sources located above and beneath the susceptor, respectively, in a state where an upper surface of a lift pin inserted in a through-hole having openings at a front and a rear surfaces of the susceptor has a level difference with respect to the opening at the front surface side, the method including an adjustment step of measuring a level difference from the opening to the upper surface of the lift pin in the above state, and adjusting a ratio of the output of the upper heat source located above the susceptor to the output of the lower heat source located beneath the susceptor on the basis of the measured level difference, an appropriate pair of the level difference and the ratio of the outputs, which pair is suitable for flattening a surface of the epitaxial layer, has been set in advance within a predetermined range of the level difference in the state where the upper surface of the lift pin retracts in the through-hole, in the adjustment step, when the measured level difference is within the predetermined range, the outputs of the heaters are adjusted to the ratio that makes an appropriate pair with the measured level difference, and the appropriate pair of the level difference and the ratio of the outputs has been set as follows: the greater the retraction amount of the upper surface of the lift pin with respect to the opening is, the greater the ratio of the output of the lower heat source to the sum of the output of the upper and the lower heat source is.

2. The method of manufacturing an epitaxial wafer according to claim 1, wherein in the adjustment step, the susceptor and the lift pin are replaced when the measured level difference is outside the predetermined range.

3. The method of manufacturing an epitaxial wafer according to claim 1, wherein assuming that a total of the outputs of the upper and lower heat sources is 100%, the ratio of the output of the upper heat source to the output of the lower heat source is adjusted within a range of 55%:45% to 40%:60%.

4. The method of manufacturing an epitaxial wafer according to claim 1, wherein in the adjustment step, the level difference is measured by using a laser.

* * * * *